United States Patent
Madge

(10) Patent No.: US 6,601,008 B1
(45) Date of Patent: Jul. 29, 2003

(54) PARAMETRIC DEVICE SIGNATURE

(75) Inventor: Robert Madge, Portland, OR (US)

(73) Assignee: LSI Logic Corporation, Milpitas, CA (US)

( * ) Notice: Subject to any disclaimer, the term of this patent is extended or adjusted under 35 U.S.C. 154(b) by 107 days.

(21) Appl. No.: 09/920,890

(22) Filed: Aug. 2, 2001

(51) Int. Cl.[7] .............................................. G06F 19/00
(52) U.S. Cl. ........................ 702/117; 702/118; 700/121
(58) Field of Search .............................. 702/117, 35, 36, 702/40, 57–59, 81–84, 118, 183, 185, 187, FOR 103, FOR 104, FOR 124, FOR 125, FOR 134, FOR 137, FOR 139, FOR 170, FOR 171; 700/109, 110, 115, 121; 324/537, 765, 73.1; 438/14, 16–18; 716/4; 382/145; 209/573, 571

(56) References Cited

U.S. PATENT DOCUMENTS

| | | | | |
|---|---|---|---|---|
| 5,927,512 A | * | 7/1999 | Beffa ........................... | 209/573 |
| 6,049,624 A | * | 4/2000 | Wilson et al. ............... | 382/145 |
| 6,161,213 A | | 12/2000 | Lofstrom ....................... | 716/4 |
| 6,329,832 B1 | * | 12/2001 | Cobbley et al. ............ | 324/765 |

* cited by examiner

Primary Examiner—Hai Wachsman
(74) Attorney, Agent, or Firm—Luedeka, Neely & Graham

(57) ABSTRACT

A method of tracking information associated with an integrated circuit on a substrate after it has been diced. A set of parameters is collected during a first testing process. A first signature is determined for the integrated circuit, based on the set of parameters collected during the first testing process. The first signature and other information are associated with the integrated circuit. The integrated circuit is diced. The set of parameters is collected anew during a second testing process. A second signature is determined for the integrated circuit, based on the data set of parameters collected anew during the second testing process. The second signature is compared to multiple first signatures to locate the first signature that substantially matches the second signature. The other information associated with the first signature is associated with the diced integrated circuit.

20 Claims, 1 Drawing Sheet

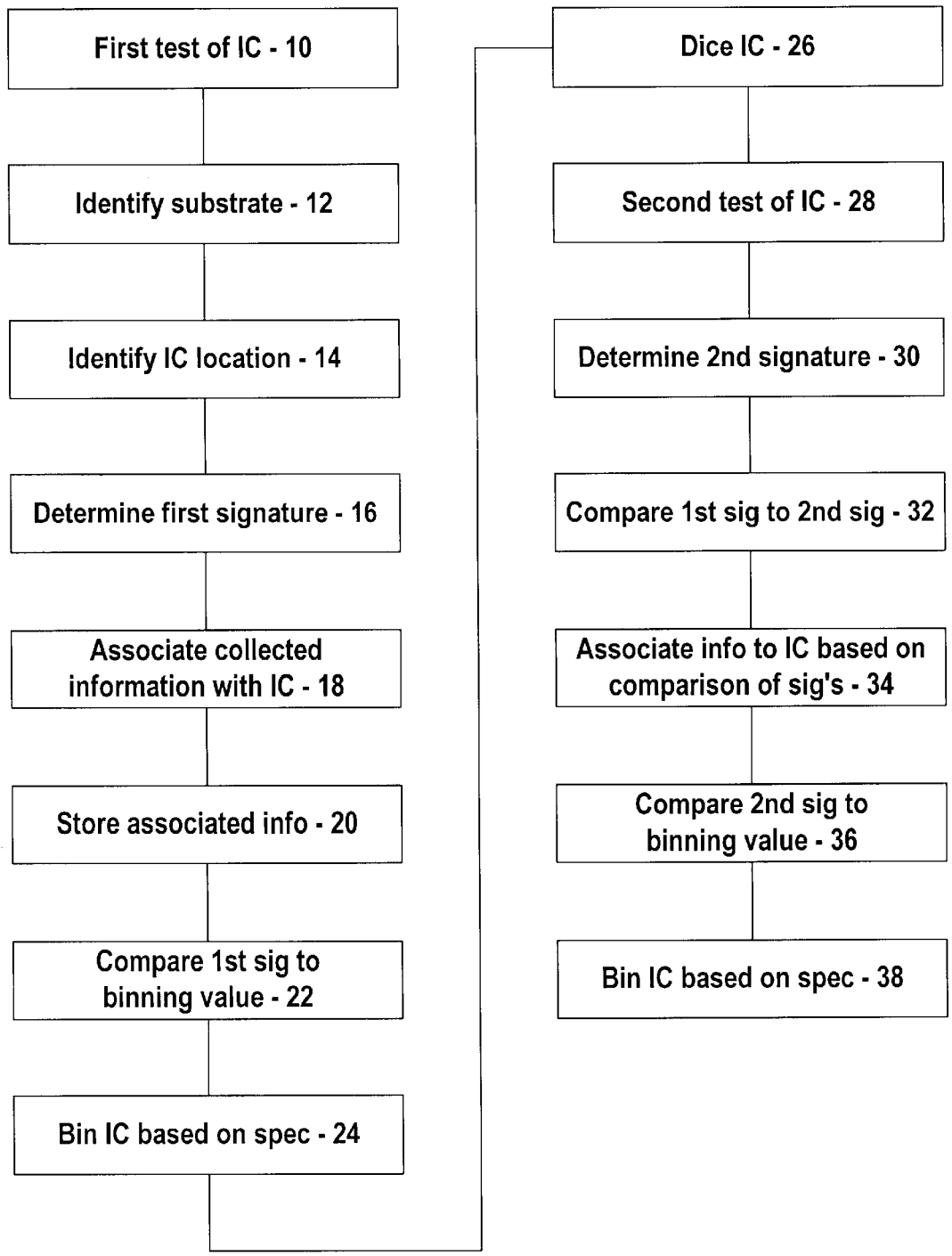

PARAMETRIC DEVICE SIGNATURE

FIELD

This invention relates to the field of integrated circuit manufacturing. More particularly, this invention relates to die location tracking and integrated circuit binning.

BACKGROUND

Tracking the dice on which integrated circuits are manufactured, such as semiconductor devices, is typically viewed as an important function. Tracking the dice may be divided into two distinct, but related concepts. This first concept is tracking the location of a die on the substrate through the subsequent dicing, testing, and sorting operations. As is appreciated, without some mechanism for tracking the substrate location of a given die, this information tends to be forever lost once the die is diced and removed from the dicing tape.

Tracking the substrate location of a die may, in many different cases, be important for improving final test yields. For example, by tracking the dice that exhibit a specific failure at final test, it may be determined that all of the dice originate from a specific portion of each processed substrate. Information such as this helps engineers to discover and correct processing problems.

Traditionally, dice have been tracked according to this first concept by methods such as laser inscribing information such as the lot number, substrate number, and location of the die on the substrate onto an open portion of the die. Unfortunately, this method requires that at least a minimal amount of substrate surface area be left unused by the integrated circuit, so that there is room to laser scribe each die. Thus, this method tends to be in direct competition with the design goal of generally reducing the size of the dice on which integrated circuits are fabricated. This method also requires that a lengthy and expensive laser scribing process be added to the substrate processing.

The second concept is readily identifying dice that have not fully passed the inspections at various points in the processing, such as wafer sort or final test. Identification of these maverick integrated circuits is important so that they are not packaged and shipped to customers and fully operational devices. Traditionally, dice have been tracked according to this second concept by methods such as placing an ink drop on the maverick die. Unfortunately, this method tends to eliminate the possibility of binning the integrated circuits into various quality levels. Rather, the die either has an ink blot and is scrapped, or doesn't have an ink blot and is passed. Thus, there is no ability with this method to bin the integrated, circuits into several different grades.

Thus, the traditional methods as described above tend to require additional steps or additional surface area on the die, and also tend to be somewhat limiting. What is needed, therefore, is a method for tracking dice in a manner where both substrate location and test results for the dice are not lost, and where additional steps and additional surface area on the dice are not required.

SUMMARY

The above and other needs are met by a method of tracking information associated with an integrated circuit on a substrate to the integrated circuit after it has been diced. As a part of the process, a data set of parameters is collected from the integrated circuit during a first testing process. A first signature is determined for the integrated circuit, based at least in part on the data set of parameters collected from the integrated circuit during the first testing process. The data set of parameters and other information are associated with the integrated circuit.

The integrated circuit on the substrate is diced to separate the integrated circuit from the substrate. The data set of parameters is collected anew from the integrated circuit during a second testing process. A second signature is determined for the integrated circuit, based at least in part on the data set of parameters collected anew from the integrated circuit during the second testing process.

The second signature is compared to multiple first signatures to locate the first signature that substantially matches the second signature. The other information associated with the first signature is associated with the diced integrated circuit.

Thus, the method as described above provides a way for a diced integrated circuit to be associated with information in regard to the integrated circuit that was collected or known prior to dicing the integrated circuit, without the need for methods such as laser scribing. The present method works without the need to add special circuitry to the integrated circuit. In other words, the method is preferably performed on production circuitry rather than test circuitry. Production circuitry is understood to refer to that circuitry for which the integrated circuit is fabricated, which circuitry is available for productive use in an application of the integrated circuit by the end user. Test circuitry, on the other hand, is typically not used in an application by an end user, but is instead used during production of the integrated circuit to ensure that various processes and structures are performed and fabricated properly. Thus, test circuitry is often considered to be a necessary evil because it is not generally useful to the end user, and it takes up valuable surface area on the chip which could otherwise either be used by production circuitry or eliminated altogether to reduce the size of the chip.

The method works by creating a unique signature for the integrated circuit, based on test results. The test results from which the unique signature is created are stored with the information that is to be tracked, such as die location on the substrate. At a later point in time, such as after the integrated circuit is diced, and the other information is no longer able to be determined from the integrated circuit alone, the same tests can be run on the diced integrated circuit, and the unique signature can be recreated from the test results. The recreated signature can be compared to signatures derived from the original test results, until two of the signatures agree with a high degree of certainty. When this is done, the other information associated with the first test results may be reliably associated with the diced integrated circuit.

Thus, a preferred method according to present invention uses tests that are already performed to identify the integrated circuit. Thus, there is no extra testing or data collection. The method also provides the opportunity to identify maverick die signatures and bin the dice on this basis. Substrate based identification methods do not provide these same benefits.

In various preferred embodiments of the invention, at least one of the first signature and the second signature are compared to at least one binning value. The integrated circuit is binned based at least in part on whether at least one of the first signature and the second signature associated with the integrated circuit violates the at least one binning value. Preferably, the other information associated with the integrated circuit includes at least one of the first signature, a substrate designation for the substrate on which the integrated circuit is located, and a location designation for the integrated circuit on the substrate. The first testing process is preferably wafer sort, and the second testing process is preferably final test.

The data set of parameters and the other information associated with the integrated circuit are preferably stored on a storage medium after collecting the data set of parameters. The storage medium may be, for example, one or more of magnetic media, optical media, and electronic media.

In one embodiment, the data set of parameters collected during the first testing process is a part of a first meta data set of parameters, and the data set of parameters collected during the second testing process is a part of a second meta data set of parameters. In other words, more data may be collected during the first and second testing processes than is used to determine the signature for the integrated circuit. The first meta data set of parameters and the second meta data set of parameters may or may not be the same meta data set of parameters in various embodiments of the method.

BRIEF DESCRIPTION OF THE DRAWINGS

Further advantages of the invention are apparent by reference to the detailed description when considered in conjunction with the FIGURE, which is a flow chart of a method according to a preferred embodiment of the invention.

DETAILED DESCRIPTION

Referring now to the figure, there is depicted a flow chart of a preferred embodiment of the method. The integrated circuit is first tested, as given in block 10. In a preferred embodiment, this first test is one such as is commonly called wafer sort. During the first test, a data set of parameters is collected from the integrated circuit. The data set of parameters may be a part of a larger data set of parameters, or a first meta set, that is collected during the first test. In other words, the data set of parameters as referred to hereafter may be a subset of all of the data that is collected during the first test.

When the data set of parameters is collected during the first test, the integrated circuit is preferably in wafer form, meaning that it and the other integrated circuits on the substrate have not as yet been diced, or if they have been diced, then they have not as yet been picked off of the dicing tape. Thus, at this point in the method, certain information in regard to the integrated circuit is still readily identifiable. For example, the designation of the substrate on which the integrated circuit was processed can be identified, as given in block 12, and the relative location of the integrated circuit on the substrate can also be identified, as given in block 14. After the integrated circuit is diced and removed from the dicing tape, it becomes increasingly more difficult, if not impossible, to identify either the substrate or the location on the substrate from which the integrated circuit was taken. Thus, information such as this is preferably collected at this point in the method.

A first signature is determined for the integrated circuit, as given in block 16. The first signature is preferably determined from the data set of parameters that was collected during the first test. In other words, at least a subset of all of the data collected during the first test is used to construct a signature for the integrated circuit. The signature is preferably created by inserting the results from the first test, or in other words the data set of parameters, into a known equation or algorithm, which uses the data set of parameters to determine a signature that is substantially unique to the integrated circuit.

The signature for the integrated circuit can be designed to be substantially unique by using sets of data values that have a high probability of having at least one characteristic that is unique from one integrated circuit to another integrated circuit. In this manner, the, set of data values can be manipulated to produce a signature, such as a single multi-digit number, that is substantially unique. By making the signature with a digit length that is sufficiently large, there can be a great number of possible unique signatures. For example, if the signature is ten digits long, then there are $10^{10}$ possible unique signatures. Thus, the computation by which the signatures are generated can be tailored to produce a signature of desired length, depending at least in part on the projected desired number of unique signatures.

For example, if an integrated circuit processing facility has approximately five million integrated circuits flowing through back end processing at any given time, and if it is desired to be able to uniquely identify each of those five million devices according to the present method, then the signature only needs to be seven digits long in order for each of the five million devices to have a unique one of the signatures.

However, in this example as given above, there would only be a total of ten million signatures available. This number of available signatures might not provide an adequate degree of resolution to differentiate between two integrated circuits that have data sets of parameters, or in other words test results, that are fairly similar. In other words, with only seven digits available for the signature, the determination of the signatures for two similarly testing integrated circuits might produce the same signature.

However, by making the signature longer than this minimum signature length, the possibility of producing the same signature for two different integrated circuits is reduced. This could be accomplished in the example given above by structuring signatures to have lengths of ten digits or fifteen digits, for example. If a high degree of resolution of desired, which in turn equates to a high probably of producing a unique signature for a given integrated circuit, then a much larger number of digits could be used, such as 128, for example. Thus, there are several different considerations to be taken into account when structuring both the process used for creating the signature, and the length of signature itself.

The collected information is associated with the integrated circuit, as given in block 18. Examples of the collected information include measurements of voltages, currents, and timing delays of the integrated circuit. Preferably this information includes the first signature, the data set of parameters gathered during the first test, and the substrate specific information, such as the substrate designation and the position of the integrated circuit on the substrate. In a most preferred embodiment, this information is stored on a medium, such as magnetic media like a disk or hard drive, optical media like a CD, or electronic media like a flash memory, as given in block 20.

In one embodiment it is not necessary to either determine the first signature or store the first signature at this point in the method. In this embodiment the other information is preferably stored on the medium, but the first signature is not. If at some later point in time it is desired to track a diced integrated circuit with its previously stored information, then the stored data set of parameters can be read off of the medium and the first signature can be determined at that time. This embodiment tends to cut down on the amount of processing of the data set of parameters that is initially required, but tends to require an increased amount of processing of the data set of parameters at a later point in time. Further, if this embodiment is used, then the first signature cannot be used immediately, as described in more detail below.

The first signature is preferably compared to at least one binning value, as given in block 22. This may be accomplished by comparing the first signature to a tolerance range of signatures, where the range of signatures indicates whether the integrated circuit associated with the signature passes or fails. However, the first signature can also be compared to several ranges of signatures, where the different signature ranges are used for binning the associated integrated circuit into one of many different binned ranges. Thus, the computed first signature can provide a very quick means for determining how the integrated circuit should be binned. This is accomplished because the first signature is preferably based on the data set of parameters collected at the first testing process. Thus, the various binning values for each of the different parameters can also be used to construct tolerance signatures, which are then used to bin the integrated circuits, as given in block 24.

The integrated circuit is preferably diced, as given in block 26. At a point in time subsequent to the dicing operation, the integrated circuit is typically picked off of the dicing tape, and is thus removed from the context of the substrate, as described above. Thus, as the integrated circuit goes through subsequent processing, it is very easy to lose track of the substrate information, such as designation and location. The integrated circuit typically undergoes many different steps through the balance of this back end processing. However, for the sake of simplicity in this explanation, these subsequent steps are generally referred to as packaging and final test.

Preferably, the integrated circuit is again tested during a second testing procedure, such as final test, where the data set of parameters is collected anew. Similar to that as described above, the data set of parameters may again be a part of a larger data set of parameters that is collected during the second test, called a second meta set of data. In other words, the data set of parameters as referred to hereafter may be a subset of all of the data that is collected during the final test. However, regardless of whether the final test is exactly the same set of tests as the wafer sort test, each of the first and second tests preferable include the same data set of parameters that is used to construct a signature.

A second signature is determined for the integrated circuit, as given in block 30. The second signature is preferably determined from the data set of parameters that was collected during the second test. In other words, at least a subset of all of the data collected during the second test is used to construct a signature for the integrated circuit. The signature is preferably created by inserting the results from the second test, or in other words the data set of parameters, into the same known equation or algorithm as that used to create the first signature, which uses the data set of parameters to determine a signature that is substantially unique to the integrated circuit.

Most preferably, the second signature for the integrated circuit is identical to the first signature for the integrated circuit, because the integrated circuit will not have deteriorated or otherwise significantly changed through packaging and final test. However, in other embodiments, the data set of parameters for the integrated circuit will have changed to some small degree, thus yielding a second signature that is somewhat different from the first signature. In either case, the second signature is compared to the first signatures, as given in block 32.

In the case where the retested data set of parameters has not changed in any significant way and the second signature is identical to the first signature, the second signature can be used as a reference to go back to the information that was stored in association with the integrated circuit at wafer sort, and by matching the second signature to the first signature, the associated information for the integrated circuit can be re-associated with the packaged and tested integrated circuit, as desired, as given in block 34. Thus, the method provides a way in which packaged integrated circuits can be re-associated with information that was known at wafer sort, but lost through subsequent back end processing.

In the case where the retested data set of parameters has changed somewhat and the second signature is not identical to the first signature, the second signature can still be used as a reference to find a first signature that most closely matches the second signature. Then, the information associated with the integrated circuit having this most closely matching first signature is associated with the integrated circuit having the second signature, as given in block 34. By having signatures with a sufficiently high degree of resolution, as discussed above, this method still produces a highly probable match between a packaged and tested integrated circuit and the information that is typically known during wafer sort and lost after dicing the integrated circuit.

Similar to that as described above, the second signature is preferably compared to at least one binning value, as given in block 36. This may be accomplished by comparing the second signature to a tolerance range of signatures, where the range of signatures indicates whether the packaged integrated circuit associated with the signature passes or fails. However, the second signature can also be compared to several ranges of signatures, where the different signature ranges are used for binning the associated integrated circuit into one of many different binned ranges. Thus, the computed second signature can provide a very quick means for determining how the integrated circuit should be binned. As before, this is accomplished because the second signature is preferably based on the data set of parameters collected at the second testing process. Thus, the various binning values for each of the different parameters can also be used to construct tolerance signatures, which are then used to bin the integrated circuits, as given in block 38.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A method of tracking information associated with an integrated circuit on a substrate to the integrated circuit after the integrated circuit has been diced, the method comprising the steps of:

collecting a data set of parameters from production circuitry of the integrated circuit on the substrate during a first testing process, determining a first signature for the integrated circuit on the substrate based at least in part on the data set of parameters collected from the integrated circuit on the substrate during the first testing process, associating the data set of parameters and other information with the integrated circuit on the substrate, dicing the integrated circuit on the substrate to separate the integrated circuit from the substrate, collecting anew the data set of parameters from the integrated circuit during a second testing process, determining a second signature for the integrated circuit based at least in part on the data set of parameters collected anew from the integrated circuit during the second testing process, comparing the second signature to a pool of first signatures to locate the first signature that substantially matches the second signature, and associating the other information associated with the first signature with the diced integrated circuit.

2. The method of claim 1, further comprising:

comparing at least one of the first signature and the second signature to at least one binning value, binning the integrated circuit based at least in part on the comparison of the at least one of the first signature and the second signature associated with the integrated circuit and the at least one binning value.

3. The method of claim 1, wherein the other information includes at least one of the first signature, a substrate designation for the substrate on which the integrated circuit is located, and a position designation for the integrated circuit on the substrate.

4. The method of claim 1, wherein the first testing process comprises wafer sort.

5. The method of claim 1, wherein the second testing process comprises final test.

6. The method of claim 1, further comprising storing the data set of parameters and the other information associated with the integrated circuit on a storage medium after the step of collecting the data set of parameters.

7. The method of claim 6, wherein the storage medium comprises magnetic media.

8. The method of claim 6, wherein the storage medium comprises optical media.

9. The method of claim 6, wherein the storage medium comprises electronic media.

10. The method of claim 1, wherein the data set of parameters collected during the first testing process is a part of a first meta data set of parameters, and the data set of parameters collected during the second testing process is a part of a second meta data set of parameters.

11. A method of tracking information associated with an integrated circuit on a substrate to the integrated circuit after the integrated circuit has been diced, the method comprising the steps of:

collecting a data set of parameters from production circuitry of the integrated circuit during a first testing process, collecting the substrate designation for the substrate on which the integrated circuit is located, collecting a position designation for the integrated circuit on the substrate, determining a first signature for the integrated circuit based at least in part on the data set of parameter collected from the integrated circuit during the first testing process, associating the first signature, the data set of parameters, the substrate designation, and the position integrated with the integrated circuit.

storing the associated first signature, data set of parameters, substrate designation, and position designation for the integrated circuit on a storage medium, dicing the integrated circuit on the substrate to separate the integrated circuit from the substrate, collecting anew the data set of parameters from the integrated circuit during a second testing process, determining a second signature for the integrated circuit based at least in part on the data set of parameters collected anew from the integrated circuit during the second testing process, comparing the second signature to a pool of first signatures to locate the first signature that can be uniquely associated with the second signature, and associating the substrate designation and the position designation associated with the first signature with the diced integrated circuit.

12. The method of claim 11, further comprising:

comparing at least one of the first signature and the second signature to at least one binning value, binning the integrated circuit based at least in part on the comparison of the at least one of the first signature and the second signature associated with the integrated circuit and the at least one binning value.

13. The method of claim 11, wherein the first testing process comprises wafer sort.

14. The method of claim 11, wherein the second testing process comprises final test.

15. The method of claim 11, wherein the storage medium comprises magnetic media.

16. The method of claim 11, wherein the storage medium comprises optical media.

17. The method of claim 11, wherein the storage medium comprises electronic media.

18. The method of claim 11, wherein the data set of parameters collected during the first testing process is a part of a first meta data set of parameters, and the data set of parameters collected during the second testing process is a part of a second meta data set of parameters.

19. A method of tracking information associated with an integrated circuit on a substrate to the integrated circuit after the integrated circuit has been diced, the method comprising the steps of:

collecting a data set of parameters room production circuitry of the integrated circuit during wafer sort, collecting the substrate designation for the substrate on which the integrated circuit is located, collecting a position designation for the integrated circuit on the substrate, determining a first signature for the integrated circuit based at least in part on the data set of parameters collected from the integrated circuit during wafer sort, associating the first signature, the data set of parameters, the substrate designation, and the position designation with the integrated circuit, storing the associated first signature, data set of parameters, substrate designation, and position designation for the integrated circuit on a disk, comparing the first signature to at least one binning value, binning the integrated circuit based at least in part on the comparison of the first signature associated with the integrated circuit and the at least one binning value, dicing the integrated circuit on the substrate to separate the integrated circuit from the substrate, collecting anew the data set of parameters from the integrated circuit during a final test, determining a second signature for the integrated circuit based at least in part on the data set of parameters collected anew from the integrated circuit during the final test, comparing the second signature to a pool of first signatures to locate the first signature that substantially matches the second signature, associating the substrate designation and the position designation associated with the first signature with the diced integrated circuit, comparing the second signature to at least one binning value, and binning the integrated circuit based at least in part on the comparison of the second signature associated with the integrated circuit and the at least one binning value.

20. The method of claim 19, wherein the data set of parameters collected during wafer sort is a part of a first meta data set of parameters, and the data set of parameters collected during the final test is a part of a second meta data set of parameters.

* * * * *